(12) United States Patent
Kwon et al.

(10) Patent No.: US 9,123,680 B2
(45) Date of Patent: Sep. 1, 2015

(54) ORGANIC LIGHT EMITTING DISPLAY PANEL AND METHOD OF MANUFACTURING ORGANIC LIGHT EMITTING DISPLAY PANEL

(75) Inventors: Oh-June Kwon, Yongin (KR);
Seung-Yong Song, Yongin (KR);
Dong-Won Han, Yongin (KR);
Dae-Beom Shin, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 483 days.

(21) Appl. No.: 13/303,618

(22) Filed: Nov. 23, 2011

(65) Prior Publication Data

US 2012/0161618 A1    Jun. 28, 2012

(30) Foreign Application Priority Data

Dec. 27, 2010    (KR) .................. 10-2010-0135583

(51) Int. Cl.
*H01J 63/04* (2006.01)
*H01L 27/32* (2006.01)
*H01L 51/52* (2006.01)

(52) U.S. Cl.
CPC ......... *H01L 27/3276* (2013.01); *H01L 51/5253* (2013.01)

(58) Field of Classification Search
CPC .................................................. H01L 27/3276

USPC ............................................................ 313/506
See application file for complete search history.

(56) References Cited

U.S. PATENT DOCUMENTS

| | | | |
|---|---|---|---|
| 2003/0173894 A1* | 9/2003 | Choi et al. ..................... | 313/504 |
| 2006/0181206 A1* | 8/2006 | Yamazaki et al. ............ | 313/506 |
| 2007/0024795 A1* | 2/2007 | Kim ................. | 349/152 |
| 2007/0035239 A1* | 2/2007 | Kang et al. ..................... | 313/504 |
| 2009/0134782 A1 | 5/2009 | Kim | |
| 2009/0206734 A1 | 8/2009 | Kim et al. | |
| 2009/0267487 A1 | 10/2009 | Kwack et al. | |

FOREIGN PATENT DOCUMENTS

| | | | |
|---|---|---|---|
| JP | 2001-237065 A | | 8/2001 |
| JP | 2007-322591 A | | 12/2007 |
| JP | 2008-186778 A | | 8/2008 |
| KR | 10-2007-0050774 A | | 5/2007 |
| KR | 102007009836 A | * | 10/2007 |
| KR | 10-2009-0089586 A | | 8/2009 |
| KR | 10-2009-0112387 A | | 10/2009 |

* cited by examiner

*Primary Examiner* — Anh Mai
*Assistant Examiner* — Hana Featherly
(74) *Attorney, Agent, or Firm* — Knobbe, Martens, Olson & Bear, LLP

(57) ABSTRACT

An organic light emitting display panel is disclosed. In one embodiment, the panel includes a pad portion includes: a protection film disposed on an encapsulation layer for encapsulating a pixel portion and extending to the pad portion, wherein the protection film has conductivity in an area corresponding to the pad portion.

11 Claims, 10 Drawing Sheets

ORGANIC LIGHT EMITTING DISPLAY PANEL AND METHOD OF MANUFACTURING ORGANIC LIGHT EMITTING DISPLAY PANEL

CROSS-REFERENCE TO RELATED PATENT APPLICATION

This application claims the benefit of Korean Patent Application No. 10-2010-0135583, filed on Dec. 27, 2010, in the Korean Intellectual Property Office, the disclosure of which is incorporated herein in its entirety by reference.

BACKGROUND

1. Field

The described technology generally relates to an organic light emitting display panel and a method of manufacturing the organic light emitting display panel.

2. Description of the Related Technology

Organic light emitting displays are widely used across a large gamut of products ranging from personal portable devices such as MP3 players and mobile phones to large displays such as television sets, since the organic displays have superior characteristics such as wide viewing angles, high contrast ratios, short response times, and reduced power consumption.

SUMMARY

One inventive aspect is an organic light emitting display panel in which a protection film is easily applied on a thin film encapsulation layer.

Another aspect is an organic light emitting display panel that stably supplies power to all regions of a pixel portion.

Another aspect is an organic light emitting display panel comprising: a substrate; a pixel portion formed over the substrate, wherein a plurality of pixels are formed in the pixel portion; a pad portion formed outside the pixel portion, wherein a plurality of pad electrodes are formed in the pad portion and electrically connected to the pixels; an encapsulation layer configured to encapsulate the pixel portion; and a protection film disposed on the encapsulation layer and extending to the pad portion, wherein the protection film has conductivity in an area corresponding to the pad portion.

In the above panel, the protection film is an anisotropic conductive film (ACF), and has conductivity only in the area corresponding to the pad portion. In the above panel, the protection film comprises a conductive ball and has conductivity only in the area corresponding to the pad portion. In the above panel, the pixel portion comprises an electrode layer disposed below the encapsulation layer, wherein the protection film comprises an auxiliary conductive area spaced apart from the area corresponding to the pad portion, formed to cover at least part of the pixel portion, and having conductivity, and wherein the organic light emitting display panel further comprises: at least one contact portion configured to electrically connect the electrode layer and the auxiliary conductive area of the protection film.

In the above panel, the at least one contact portion comprises a contact metal formed in a via hole defined in the encapsulation layer. In the above panel, the electrode layer comprises a projection portion electrically connected to the auxiliary conductive area of the protection film, extending from the electrode layer, and formed on a substrate.

The above panel further comprises: an auxiliary electrode disposed on the auxiliary conductive area of the protection film, and configured to receive power supplied to the electrode layer. In the above panel, the at least one contact portion is disposed in the center of the pixel portion.

Another aspect is a method of manufacturing an organic light emitting display panel, the method comprising: providing a substrate; forming, on the substrate, a pixel portion and a pad portion comprising a plurality of pad electrodes electrically connected to the pixel portion; forming an encapsulation layer configured to cover the pixel portion; forming, on the encapsulation layer, a protection film extending to the pad portion and comprising a conductive ball; and applying pressure to the protection film that is an area corresponding to the pad portion.

In the above method, the protection film is an ACF. In the above method, the protection film comprises the conductive ball only in the area corresponding to the pad portion. The above method is performed in a mother substrate, and the method further comprises after forming the protection film, performing a cell cutting operation on the mother substrate.

The above method is performed in the mother substrate, wherein the method further comprises after applying pressure, performing the cell cutting operation on the mother substrate. In the above method, the forming of the pixel portion and the pad portion comprises forming an electrode layer below the encapsulation layer, wherein the method further comprises before forming the protection film, forming at least one contact portion configured to electrically connect the electrode layer and the auxiliary conductive area of the protection film; and wherein after forming the protection film, pressure is applied to an auxiliary conductive area of the protection film that is spaced apart from the area corresponding to the pad portion, and is formed to cover at least a part of the pixel portion.

In the above method, the forming of the at least one contact portion comprises: forming a via hole in the encapsulation layer; and forming a contact metal in the via hole. In the above method, the forming of the electrode layer comprises: forming a projection portion electrically connected to the auxiliary conductive area of the protection film, extending from the electrode layer, and formed on the substrate. The above method further comprises: after applying pressure to the auxiliary conductive area, forming an auxiliary electrode, on the auxiliary conductive area of the protection film, configured to receive power supplied to the electrode layer. In the above method, the at least one contact portion is disposed in the center of the pixel portion.

DETAILED DESCRIPTION

Organic light emitting displays may deteriorate due to penetration of oxygen or moisture. Thus, an encapsulation structure for preventing penetration into the active regions of the display by oxygen or moisture is generally used. A thin film encapsulation structure using an organic layer and an inorganic layer is used as the encapsulation structure. However, since an encapsulation layer is inherently thin, it can be physically damaged by the imprinting of external impurities, and oxygen and moisture may then be allowed to pass such layer.

Embodiments will now be described more fully with reference to the accompanying drawings.

Figure 1:
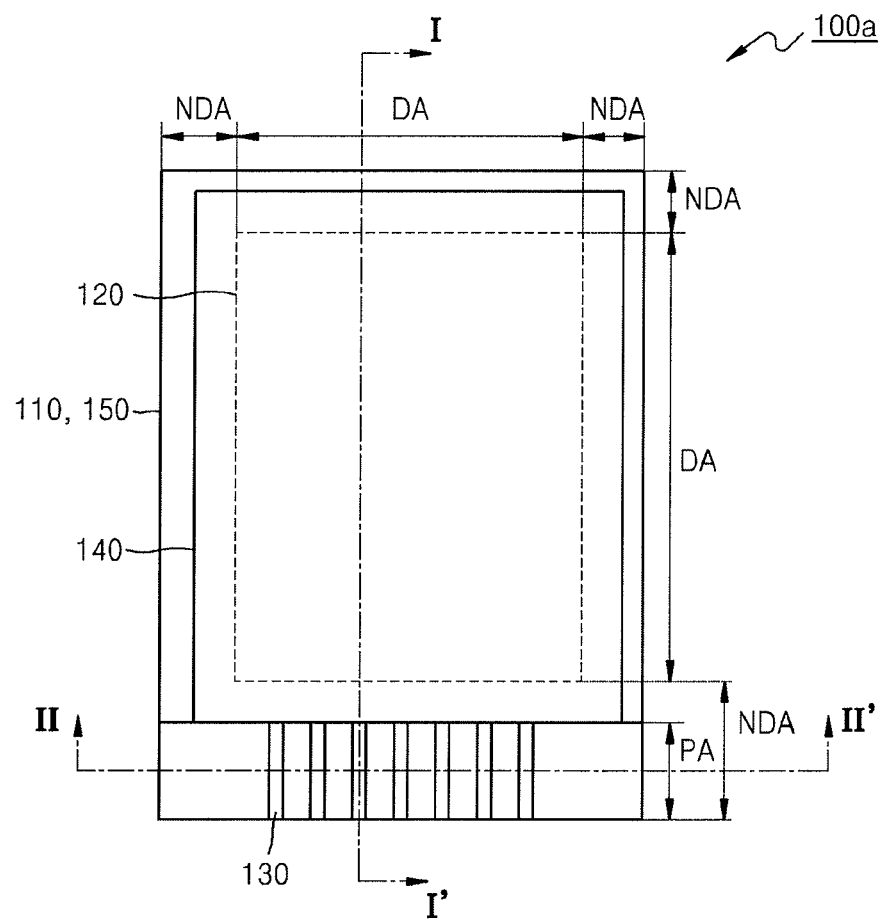
FIG. 1 is a plan view of an organic light emitting display panel according to an embodiment.
Figure 2:
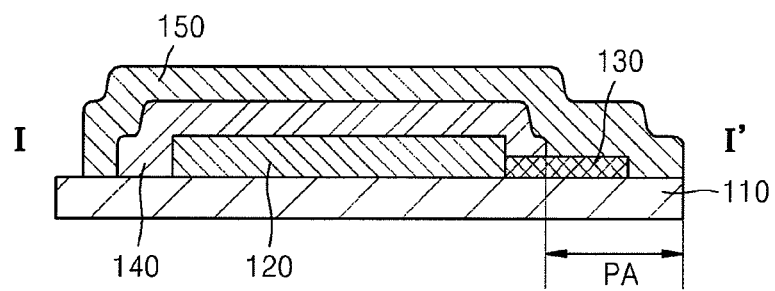
FIG. 2 is a cross-sectional view of the organic light emitting display panel taken along a line I-I' of FIG. 1.

FIG. 1 is a plan view of an organic light emitting display panel 100a according to an embodiment. FIG. 2 is a cross-sectional view of the organic light emitting display panel 100a taken along a line I-I' of FIG. 1.

The organic light emitting display panel 100a includes a substrate 110, a pixel portion 120, a pad electrode 130, an encapsulation layer 140, and a protection film 150. The substrate 110 may be a glass substrate, a metal substrate, a plastic substrate, etc.

The pixel portion 120 is formed on the substrate 110. A plurality of pixels are formed on the pixel portion 120. Each pixel includes a pixel circuit and an organic light emitting diode (OLED). The pixel circuit may include thin film transistors and capacitors. The OLED may include an organic light emitting layer disposed between a cathode and an anode. An area corresponding to the pixel portion 120 is a display area DA of the organic light emitting display panel 100a. An area other than the pixel portion 120 is a non-display area NDA.

A pad portion PA including a plurality of pad electrodes 130 is formed outside the pixel portion 120. The pad electrodes 130 are electrically connected to the pixel portion 120. The organic light emitting display panel 100a is connected to a driving circuit, a power supply portion, etc. and receives driving signals and power therefrom. Such power and driving signals are applied to the organic light emitting display panel 100a through the pad electrodes 130 of the pad portion PA. To this end, the pad electrodes 130 are electrically connected to corresponding wirings of the pixel portion 120.

The driving circuits may be mounted in a flexible printed circuit board (FPCB) that is electrically connected to the organic light emitting display panel 100a through the pad portion PA or may be mounted in an area other than an encapsulation area of the organic light emitting display panel 100a in an integrated circuit (IC) chip form.

Signal lines of the pixel portion 120, such as scan lines and/or data lines, are connected to the corresponding pad electrodes 130, and may receive scan signals and data signals supplied from the driving circuit. Further, power lines of the pixel portion 120 are connected to the corresponding pad electrodes 130 and may receive power supplied from the power supply portion.

To electrically connect the pixel portion 120 and the pad electrodes 130, connection wirings between the pixel portion 120 and the pad electrodes 130 may be disposed. The connection wirings may also extend to form the pad electrodes 130.

The encapsulation layer 140 is formed on the pixel portion 120. The encapsulation layer 140 prevents oxygen or moisture from penetrating into the pixel portion 120 and protects damage due to an external shock. In the present embodiment, the encapsulation layer 140 is formed of a thin film layer. The thin film encapsulation layer may include an inorganic layer or include both the inorganic layer and an organic layer. The inorganic layer prevents oxygen or moisture from penetrating into the organic light emitting display panel 100a. The organic layer provides the organic light emitting display panel 100a with flexibility. Hereinafter, the encapsulation layer 140 is formed as the thin film encapsulation layer and is referred to as the thin film encapsulation layer 140.

As mentioned above, since the thin film encapsulation layer 140 is thin, the thin film encapsulation layer 140 is likely to be physically damaged due to imprinting of external impurities, and oxygen and moisture are likely to penetrate thereinto. In the present embodiment, the organic light emitting display panel 100a includes the protection film 150 on the pixel portion 120 to protect the thin film encapsulation layer 140, and effectively prevents oxygen or moisture from penetrating into the pixel portion 120. The thin film encapsulation layer 140 may be formed differently from the embodiment shown in FIGS. 1 and 2 as long as the thin film encapsulation layer 140 covers and seals the pixel portion 120.

According to the present embodiment, the protection film 150 is not only formed on the thin film encapsulation layer 140 but extends to and is formed in the pad portion PA. In this embodiment, the protection film 150 is configured to have conductivity only in an area corresponding to the pad portion PA, so that the protection film 150 is used for an electrical connection in the pad portion PA while acting as a protection film. However, the protection film 150 may be formed differently from the embodiment shown in FIGS. 1 and 2 as long as the protection film 150 covers the thin film encapsulation layer 140 and the pad electrodes 130.

In the present embodiment, the protection film 150 may be conductive only in the pad portion PA by using a conductive ball of an anisotropic conductive film (ACF). For example, when the protection film 150 is the ACF, a pressure is applied to the area corresponding to the pad portion PA so that the pad portion PA has conductivity. As another example, the protection film 150 may include the conductive ball only in the area corresponding to the pad portion PA, include no conductive ball in areas other than the pad portion PA, and then pressure is applied to the protection film 150 so that the protection film 150 has conductivity only in the area corresponding to the pad portion PA.

Figure 3:
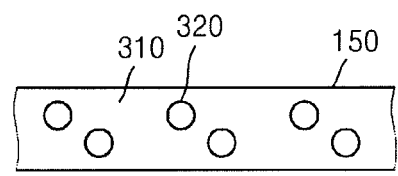
FIG. 3 is a cross-sectional view of an anisotropic conductive film (ACF).

FIG. 3 is a cross-sectional view of the ACF. Referring to FIG. 3, the ACF includes a plurality of conductive balls 320 in a binder member 310. The binder member 310 is a layer including the conductive balls 320.

The binder member 310 may be formed of, for example, PVC, polystyrene, acrylic resin, polyethylene, nylon, polyacetal resin, etc. The binder member 310 has a tolerance to acidic solution such as hydrofluoric acid solution, nitric acid, etc. used to a process of slimming the organic light emitting display panel 100a. Thus, according to the present embodiment, a process of covering the organic light emitting display panel 100a with a protection film during a slimming process is not needed.

The conductive ball 320 includes a conductive material in a coating film. If pressure is applied to the ACF, the ACF has conductivity due to the conductive material flown out from the conductive ball 320 that bursts. At this time, since a part of the conductive ball 320 to which pressure is applied bursts, the part of the conductive ball 320 to which pressure is applied has conductivity between top and bottom portions of the ACF, and a part of the conductive ball 320 to which pressure is not applied or a part of the conductive ball 320 to which pressure below a predetermined level is applied has no conductivity. Thus, a part of the ACF to which pressure is applied has conductivity, and a part of the ACF to which no pressure is applied has insulation.

FIGS. 4A through 4F are diagrams for explaining a method of manufacturing the organic light emitting display panel 100a according to an embodiment.

Figure 4A:
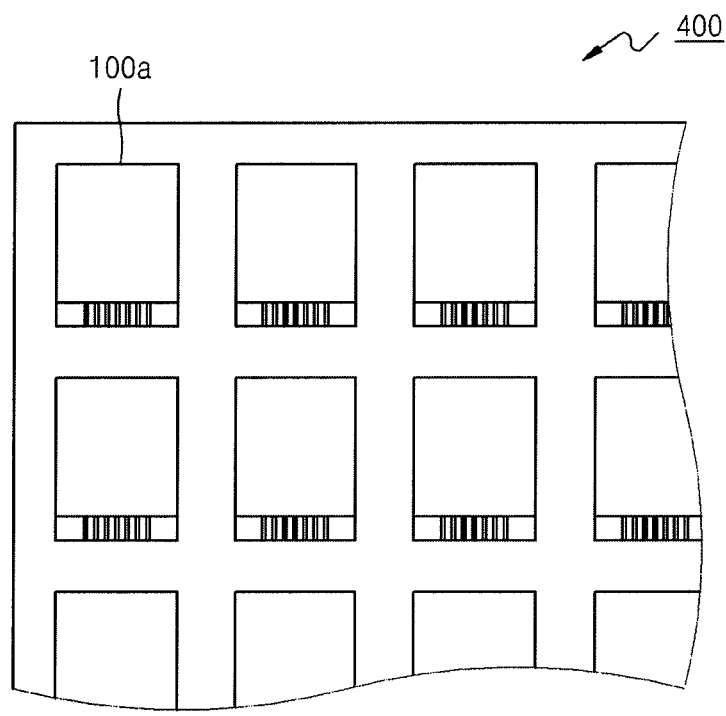
FIGS. 4A through 4F are diagrams for explaining a method of manufacturing an organic light emitting display panel according to an embodiment.

Referring to FIG. 4A, a mother substrate 400 on which a plurality of the organic light emitting display panels 100a are formed is formed. The mother substrate 400 includes the pixel portion 120 and the pad electrodes 130 formed on the substrate 110, and the thin film encapsulation layer 140 formed on the pixel portion 120.

Figure 4B:
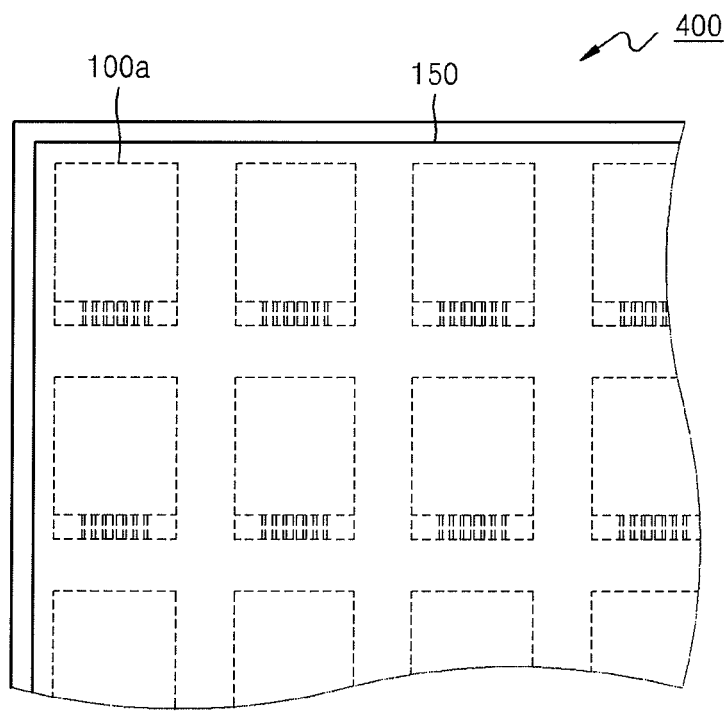

Next, referring to FIG. 4B, the protection film 150 is disposed on the mother substrate 400 to cover the organic light emitting display panels 100a. The protection film 150 is disposed on the thin film encapsulation layer 140. In this regard, the protection film 150 may include the conductive ball 320 only in the pad portion PA, or may be formed as an ACF as a whole. A process of injecting the conductive ball 320 only into the pad portion PA may be added in order for the protection film 150 to include the conductive ball 320 only in the pad portion PA.

Figure 4C:
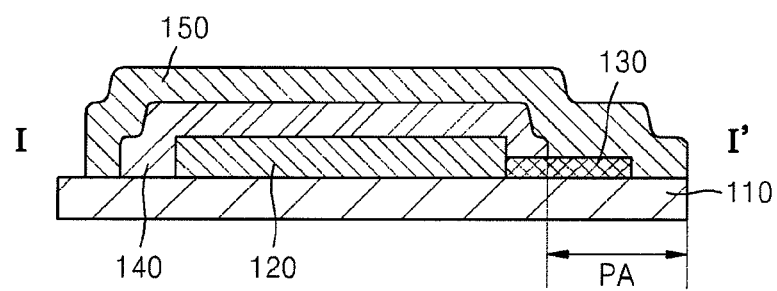

If the protection film 150 is adhered to the mother substrate 400, a cell cutting operation is performed to separate the organic light emitting display panels 100a. Referring to FIG. 4C, the protection film 150 is adhered to the organic light emitting display panels 100a by performing the cell cutting operation. In this regard, the protection film 150 has no conductivity since no pressure is applied thereto.

Figure 4D:
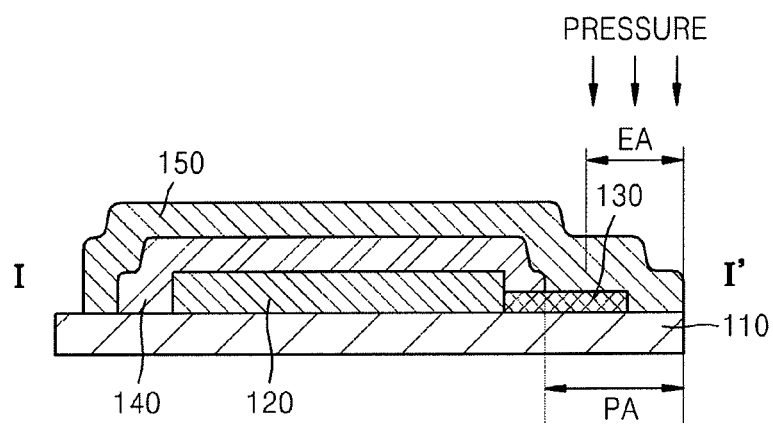

Next, referring to FIG. 4D, an area corresponding to the pad portion PA of the protection film 150 has conductivity by applying pressure to the area corresponding to the pad portion PA. In this regard, pressure may be applied to substantially the entire area corresponding to the pad portion PA or an area EA of the pad portion PA. The area EA may be determined according to a width of an area that is to be combined to an input wiring of a driving circuit or a power supply portion later.

Figure 4E:
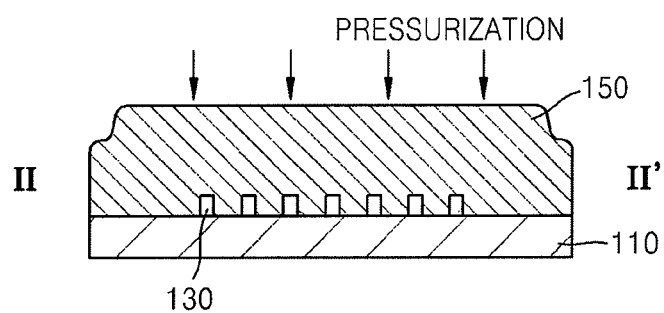

A process of applying pressure to the protection film 150 is in more detail described with reference to FIG. 4E that is a cross-sectional view of the organic light emitting display panel 100a taken along a line II-II' of FIG. 1. If pressure is applied to the protection film 150, pressure is applied to an area in which the pad electrodes 130 are formed to the extent that the conductive ball 320 bursts due to a step difference between the pad electrodes 130 and the substrate 110, and pressure is not applied to an area in which the pad electrodes 130 are not formed to the extent that the conductive ball 320 bursts. This is because the distance between the pad electrodes 130 and an upper end of the protection film 150 is smaller than the distance between the substrate 110 and the upper end of the protection film 150.

For example, if the step difference between the pad electrodes 130 and the substrate 110 is 10 μm, and the conductive ball 320 is between 6 μm and 7 μm, when pressure is applied to the protection film 150, the conductive ball 320 disposed on the pad electrodes 130 bursts due to the pressure, whereas the conductive ball 320 may not burst since no pressure is applied to the conductive ball 320 disposed in an area other than the pad electrodes 130 due to the step difference of 10 μm. Thus, if pressure is applied to the area corresponding to the pad portion PA of the protection film 150, the protection film 150 has conductivity in the area corresponding to the pad portion PA and has no conductivity in the area other than the pad electrodes 130.

Figure 4F:
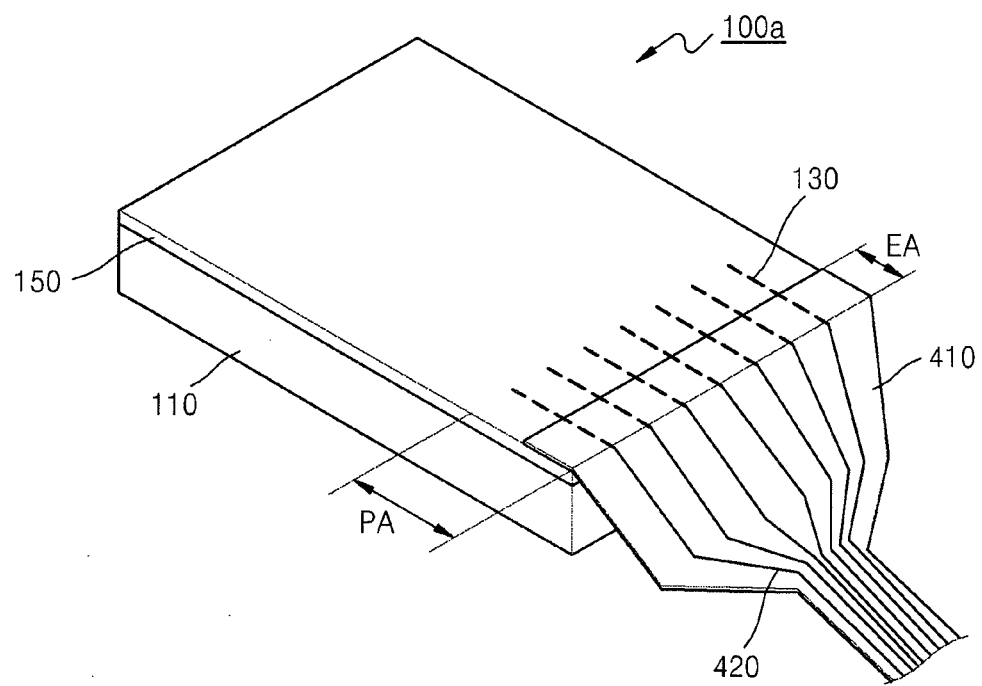

If the process of applying pressure to the protection film 150 is complete, referring to FIG. 4F, a connection member 410 of an input wiring 420 is adhered onto the protection film 150 of the pad portion PA. The input wiring 420 extends from a FPCB, an IC chip, etc. If pressure is applied to the area EA of the pad portion PA, the input wiring 420 is adhered to the protection film 150 so as to electrically contact the area EA and the input wiring 420 each other.

Figure 5:
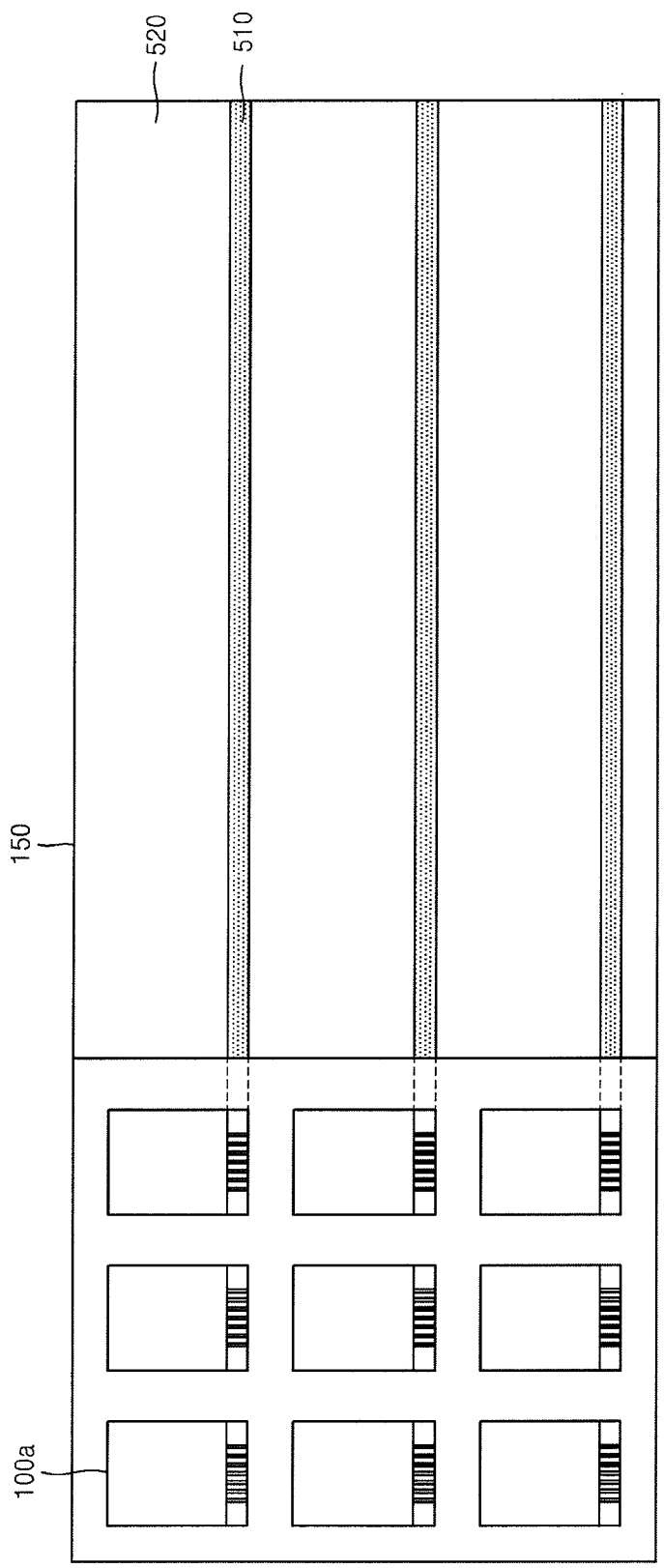
FIG. 5 is a diagram for explaining a method of manufacturing an organic light emitting display panel according to another embodiment.

FIG. 5 is a diagram for explaining a method of manufacturing the organic light emitting display panel 100a according to another embodiment.

Referring to FIG. 5, a process of applying pressure to an area 510 corresponding to the pad portion PA is performed before a cell cutting operation is performed. The protection film 150 of an area 520 has no conductivity since no pressure is applied to the area 520. If the cell cutting operation is performed after the process of applying pressure to the area 510 is complete in a mother substrate, the organic light emitting display panel 100a is provided.

Figure 6:
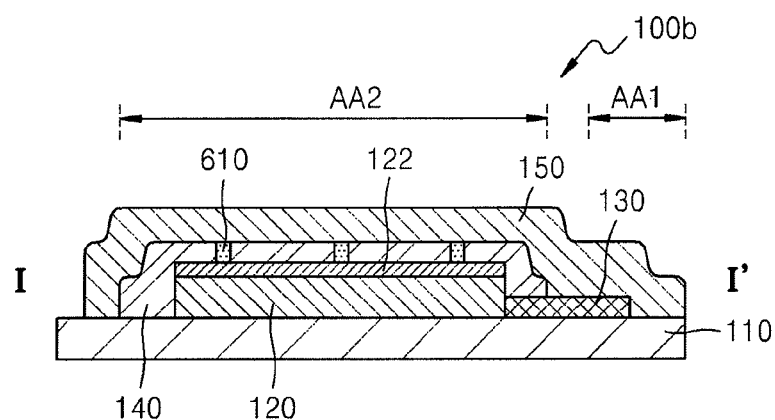
FIG. 6 is a cross-sectional view of an organic light emitting display panel taken along a line I-I' according to another embodiment.

FIG. 6 is a cross-sectional view of an organic light emitting display panel 100b taken along a line I-I' according to another embodiment.

Referring to FIG. 6, a part of the protection film 150 is used as a power bus wiring by forming an auxiliary conductive area AA2 in a partial area of the protection film 150.

Figure 7:
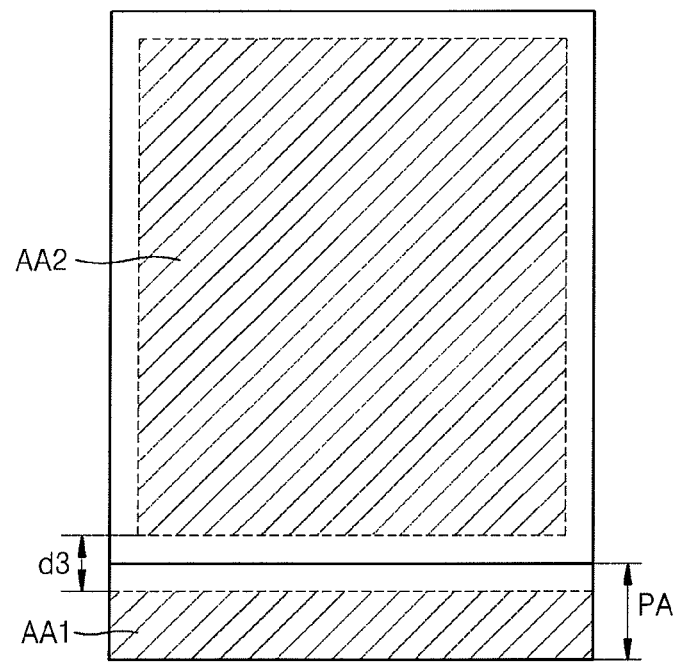
FIG. 7 is a view of conductive areas of a protection film of FIG. 6.

FIG. 7 is a view of conductive areas of the protection film 150 of FIG. 6. Referring to FIG. 7, the protection film 150 of the organic light emitting display panel 100b may include a pad conductive area AA1 and the auxiliary conductive area AA2. Such a structure may be realized by forming the protection film 150 as an ACF and applying pressure to the pad conductive area AA1 and the auxiliary conductive area AA2. A predetermined gap d3 between the pad conductive area AA1 and the auxiliary conductive area AA2 is maintained, and thus the pad conductive area AA1 and the auxiliary conductive area AA2 are insulated.

Although the pad conductive area AA1 is formed in a part of the pad portion PA in FIG. 7, the pad conductive area AA1 can be formed in substantially the entire pad portion PA. Further, although the auxiliary conductive area AA2 is spaced apart by a gap from an outermost part of the organic light emitting display panel 100b in FIG. 7, the auxiliary conductive area AA2 can be formed in the outermost part of the organic light emitting display panel 100b while maintaining a predetermined gap from the pad conductive area AA1.

A structure of the organic light emitting display panel 100b is described with reference to FIG. 6. Referring to FIG. 6, the organic light emitting display panel 100b includes an electrode layer 122 formed on the pixel portion 120. Although the electrode layer 122 is separately formed on the pixel portion 120 in FIG. 6 for convenience of description, the electrode layer 122 is included in the pixel portion 120.

The electrode layer 122 may supply power to an anode or a cathode of an OLED of the pixel portion 120 or may be connected to a thin film transistor or a capacitor of a pixel circuit so as to supply power thereto.

The electrode layer 122 may be formed of a transparent metal oxide such as ITO, IZO, ZnO, $In_2O_3$, etc.

As described above, in the present embodiment, the auxiliary conductive area AA2 of the protection film 150 is formed to have conductivity. The auxiliary conductive area AA2 of the protection film 150 is electrically connected to the electrode layer 122 through a contact portion 610. The contact portion 610 may be realized by forming the thin film encapsulation layer 140, forming a via hole in the thin film encapsulation layer 140, and forming contact metal in the via hole. A plurality of the contact portion 610 may be formed in the organic light emitting display panel 100b as shown in FIG. 6.

The contact portion 610 may be formed of a transparent metal oxide such as ITO, IZO, ZnO, $In_2O_3$, etc.

The pad conductive area AA1, as described above, may be formed in the area corresponding to the pad portion PA or in a part of the area, so that the pad electrodes 130 may be connected to a driving circuit or a power supply portion.

Each pixel of the organic light emitting display panel 100b is driven by receiving power. However, power is generally supplied to a point of the organic light emitting display panel 100b and is transferred to a plurality of pixels through power lines. In this case, an IR voltage drops due to power lines. Further, voltage levels of supplied power may differ according to location of pixels due to a load current flowing to each pixel. In the present embodiment, the auxiliary conductive area AA2 acts as a bus electrode of power so as to stably supply power that is supplied to the electrode layer 122 to all pixels of the organic light emitting display panel 100b, thereby reducing differences in voltage levels of power according to location of pixels and a drop of the IR voltage due to power lines.

In addition, the contact portions 610 are formed in a plurality of points, and thus power is substantially uniformly supplied to all pixel areas of the pixel portion 120 through the auxiliary conductive area AA2 of the protection film 150.

Figure 8:
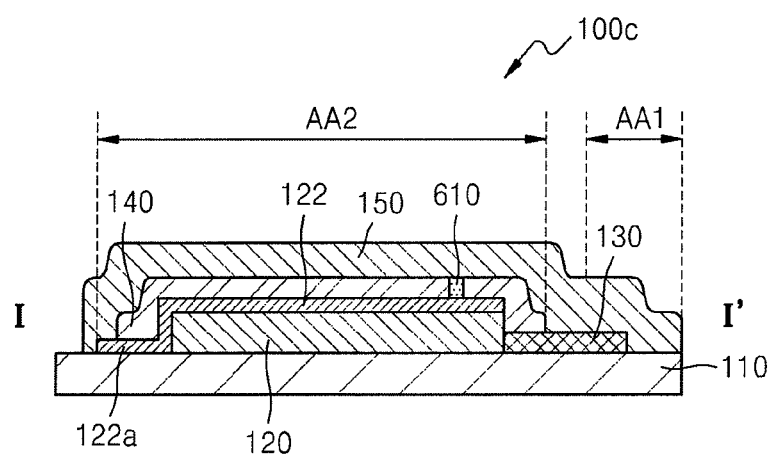
FIG. 8 is a cross-sectional view of an organic light emitting display panel taken along a line I-I' according to another embodiment.

FIG. 8 is a cross-sectional view of an organic light emitting display panel 100c taken along a line I-I' according to another embodiment.

Referring to FIG. 8, a projection portion 122a is formed on the substrate 110 by extending the electrode layer 122, and contacts the auxiliary conductive area AA2 of the protection film 150. In one embodiment, the auxiliary conductive area AA2 is determined to contact the projection portion 122a. Further, the contact portion 61 for electrically connecting the auxiliary conductive area AA2 of the protection film 150 and the electrode layer 122 is formed. In this regard, the projection portion 122a and the contact portion 610 may be formed away from each other. For example, the projection portion 122a may be disposed in the opposite side of the pad portion PA in the organic light emitting display panel 100c, and the contact portion 610 may be disposed around the pad portion PA. As another example, the projection portion 122a may be disposed around the pad portion PA, and the contact portion 610 may be disposed in the opposite side of the pad portion PA in the pixel portion 120.

Thus, the auxiliary conductive area AA2 of the protection film 150 allows power to be stably supplied to all pixels of the pixel portion 120. For example, if power is supplied from the pad portion PA, power is stably supplied to pixels near the pad portion PA, whereas power may not be stably supplied to pixels far away from the pad portion PA due to a voltage drop of power as mentioned above. In the present embodiment, power is supplied in an opposite side of the pad portion PA through the auxiliary conductive area AA2 of the protection film 150, thereby more stably supplying power to all pixels of the pixel portion 120.

As described with reference to the organic light emitting display panel 100a, the organic light emitting display panels 100b and 100c may be manufactured by performing thin film encapsulation on the organic light emitting display panels 100b and 100c, covering the protection film 150 thereon, performing a cell cutting operation on the protection film 150, and applying pressure to the protection film 150. In the organic light emitting display panels 100b and 100c, pressure is applied to both the pad conductive area AA1 and the auxiliary conductive area AA2 when pressure is applied to the protection film 150.

Figure 9:
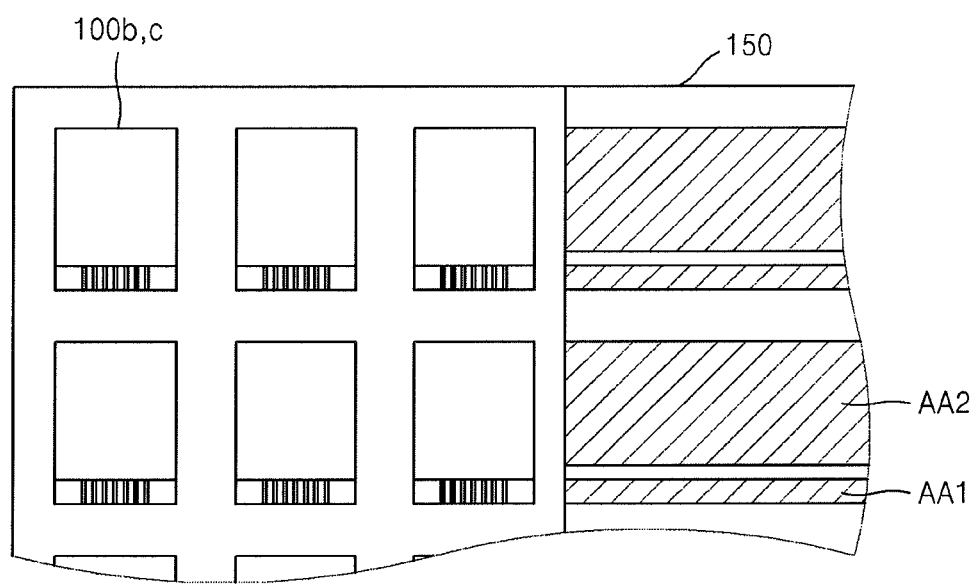
FIG. 9 is a diagram for explaining a method of manufacturing organic light emitting display panels according to another embodiment.

FIG. 9 is a diagram for explaining a method of manufacturing the organic light emitting display panels 100b and 100c according to another embodiment.

According to the method of manufacturing the organic light emitting display panels 100b and 100c, pressure is applied to the pad conductive area AA1 and the auxiliary conductive area AA2 before a cell cutting operation is performed. Referring to FIG. 9, pressure may be applied to the pad conductive area AA1 and the auxiliary conductive area AA2.

Figure 10:
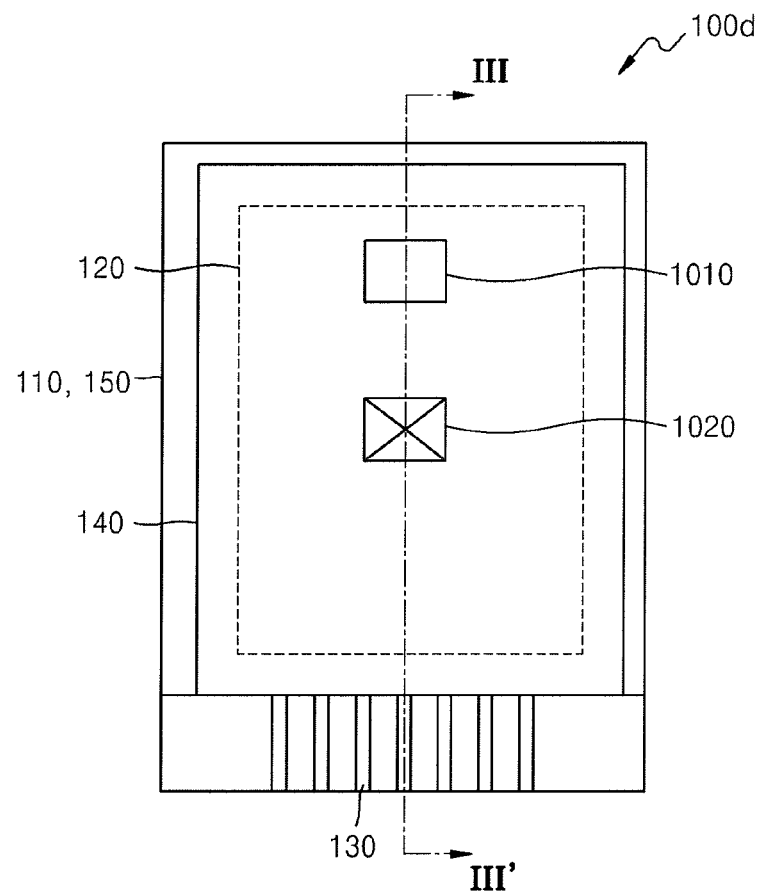
FIG. 10 is a plan view of an organic light emitting display panel according to another embodiment.
Figure 11:
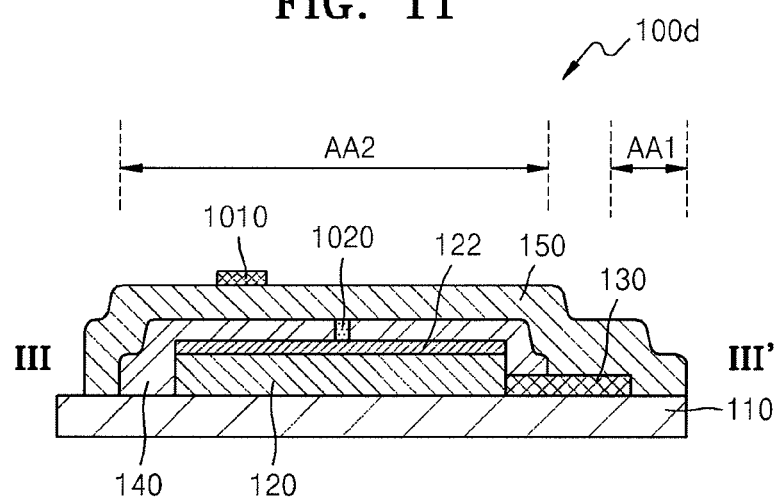
FIG. 11 is a cross-sectional view of the organic light emitting display panel taken along a line of FIG. 10.

FIG. 10 is a plan view of an organic light emitting display panel 100d according to another embodiment. FIG. 11 is a cross-sectional view of the organic light emitting display panel 100d taken along a line of FIG. 10.

Referring to FIGS. 10 and 11, the organic light emitting display panel 100d includes an auxiliary electrode 1010 formed on the protection film 150. The auxiliary electrode 1010 receives power supplied to the electrode layer 122.

The organic light emitting display panel 100d further includes a contact portion 1020 for electrically connecting the auxiliary conductive area AA2 of the protection film 150 with the electrode layer 122. As described with reference to the organic light emitting display panels 100b and 100c, the contact portion 1020 may be realized by forming the thin film encapsulation layer 140, forming a via hole in the thin film encapsulation layer 140, and forming a contact metal in the via hole. A plurality of the contact portions 1020 may be formed.

The contact portion 1020 may be formed of a transparent metal oxide such as ITO, IZO, ZnO, $In_2O_3$, etc.

The contact portion 1020 may be formed around a pixel disposed farthest from a point where power is supplied. Power is supplied from around a boundary of the pixel portion 120 to all pixels through power lines. In this regard, power may not be stably supplied to a pixel far away from the point where power is supplied due to a voltage drop of power as mentioned above. In the present embodiment, the auxiliary electrode 1010 is disposed on the auxiliary conductive area AA2 of the protection film 150 to supply power through a given power supply means, for example, the pad electrodes 130 and through the auxiliary electrode 1010 as well. The power supplied through the auxiliary electrode 1010 is supplied to the pixel far away from the point where power is supplied through the contact portion 1020, thereby stably supplying power to all pixel areas.

Although the contact portion 1020 is disposed in the center of the pixel portion 120 in FIG. 11, the contact portion 1020 may be disposed in any positions of the pixel portion 120 where power is unstably supplied in terms of a power supply position. The contact portions 1020 may be disposed in a plurality of points of the pixel portion 120.

According to at least one of the disclosed embodiments, a protection film is applied on a thin film encapsulation layer of an organic light emitting display panel, without a separate process for having a pad portion exposed, thereby reducing processing steps and manufacturing cost.

Further, power of an organic light emitting display panel is stably supplied to all regions of a pixel portion, thereby preventing pixels from deteriorating due to a power supply failure.

While embodiments have been shown and described with reference to the accompanying drawings, it will be understood by those of ordinary skill in the art that various changes in form and details may be made therein without departing from the spirit and scope of the following claims.

What is claimed is:

1. An organic light emitting display panel comprising:
a substrate;
a pixel portion formed over the substrate, wherein a plurality of pixels are formed in the pixel portion, wherein the pixel portion includes a top surface opposing the substrate;
a pad portion, wherein a plurality of pad electrodes are formed in the pad portion and electrically connected to the pixels;
an encapsulation layer covering the entire top surface of the pixel portion, wherein the encapsulation layer includes first and second ends opposing each other, wherein the first end of the encapsulation layer directly contacts the substrate and wherein the second end of the encapsulation layer directly contacts the pad portion; and
a protection film disposed on the encapsulation layer and extending to the pad portion,
wherein the protection film has conductivity in an area corresponding to the pad portion.

2. The organic light emitting display panel of claim 1, wherein the protection film is an anisotropic conductive film (ACF), and has conductivity only in the area corresponding to the pad portion.

3. The organic light emitting display panel of claim 1, wherein the protection film comprises a conductive ball and has conductivity only in the area corresponding to the pad portion.

4. The organic light emitting display panel of claim 1, wherein the protection film directly contacts the encapsulation layer and the pad portion.

5. An organic light emitting display panel comprising:
a substrate;
a pixel portion formed over the substrate, wherein a plurality of pixels are formed in the pixel portion;
a pad portion, wherein a plurality of pad electrodes are formed in the pad portion and electrically connected to the pixels;
an encapsulation layer configured to encapsulate the pixel portion; and
a protection film disposed on the encapsulation layer and extending to the pad portion,
wherein the protection film has conductivity in an area corresponding to the pad portion,
wherein the pixel portion comprises an electrode layer disposed below the encapsulation layer,
wherein the protection film comprises an auxiliary conductive area spaced apart from the area corresponding to the pad portion, formed to cover at least part of the pixel portion, and having conductivity,
and wherein the organic light emitting display panel further comprises: at least one contact portion configured to electrically connect the electrode layer and the auxiliary conductive area of the protection film.

6. The organic light emitting display panel of claim 5, wherein the at least one contact portion comprises a contact metal formed in a via hole defined in the encapsulation layer.

7. The organic light emitting display panel of claim 5, wherein the electrode layer comprises a projection portion electrically connected to the auxiliary conductive area of the protection film, extending from the electrode layer, and formed on a substrate.

8. The organic light emitting display panel of claim 5, further comprising: an auxiliary electrode disposed on the auxiliary conductive area of the protection film, and configured to receive power supplied to the electrode layer.

9. The organic light emitting display panel of claim 8, wherein the at least one contact portion is disposed in the center of the pixel portion.

10. The organic light emitting display panel of claim 5, wherein each of the pixels comprises an organic light-emitting diode (OLED) that includes an anode and a cathode, and wherein the electrode layer is configured to supply power to the anode or cathode.

11. The organic light emitting display panel of claim 5, wherein each of the pixels comprises an organic light-emitting diode (OLED) and a pixel circuit, wherein the pixel circuit comprises a thin film transistor (TFT) and a capacitor, and wherein the electrode layer is electrically connected to the TFT or capacitor.

* * * * *